US008198602B2

(12) United States Patent
Steenbrink et al.

(10) Patent No.: US 8,198,602 B2
(45) Date of Patent: Jun. 12, 2012

(54) ELECTROSTATIC LENS STRUCTURE

(75) Inventors: Stijn Willem Herman Karel Steenbrink, Den Haag (NL); Johan Joost Koning, Den Haag (NL); Peter Veltman, Nieuwerkerk a/d IJssel (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 13/076,540

(22) Filed: Mar. 31, 2011

(65) Prior Publication Data
US 2011/0216299 A1 Sep. 8, 2011

Related U.S. Application Data

(63) Continuation of application No. PCT/EP2009/062788, filed on Oct. 1, 2009.

(51) Int. Cl.
*G03B 27/54* (2006.01)
*H01J 3/14* (2006.01)
*B23P 17/04* (2006.01)

(52) U.S. Cl. .................. 250/396 R; 250/492.3

(58) Field of Classification Search .................. 250/309, 250/310, 396 R, 492.3
See application file for complete search history.

(56) References Cited

U.S. PATENT DOCUMENTS

| 6,897,450 | B2 * | 5/2005 | Yonezawa ................. 250/396 R |
| 7,045,794 | B1 | 5/2006 | Spallas |
| 8,035,082 | B2 * | 10/2011 | Yamazaki et al. ............ 250/310 |
| 2002/0005491 | A1 | 1/2002 | Yagi |
| 2005/0087696 | A1 | 4/2005 | Choi |
| 2006/0289804 | A1 | 12/2006 | Knippelmeyer |
| 2009/0212213 | A1 * | 8/2009 | Nakasuji et al. ............. 250/310 |
| 2010/0096550 | A1 * | 4/2010 | Yamazaki et al. ............ 250/310 |

FOREIGN PATENT DOCUMENTS

| JP | 63170818 A | 7/1988 |
| JP | 2000260242 A | 9/2000 |
| JP | 2005214908 A | 8/2005 |
| WO | 2008/032971 A1 | 3/2008 |

OTHER PUBLICATIONS

International Search Report and Written Opinion for PCT/EP2009/062788 (issued Apr. 16, 2010).
UKIPO Search Report for GB0817911.1 (issued Sep. 4, 2009).
UKIPO Search Report for GB0817914.5 (issued Oct. 5, 2009).
Ragnar Hellborg; Electrostatic accelerators; 1995; pp. 124-145; Springer—Verlag, Berlin, Heidelberg.
Adler R.J. et al; Advances in the development of the Nested High Voltage Generator; Particle Accelerator Conference, May 17-20, 1993; pp. 1306-1308; New York, NY, USA.

* cited by examiner

*Primary Examiner* — Bernard E Souw
(74) *Attorney, Agent, or Firm* — Hoyng Monegier LLP; David P. Owen; Coraline J. Haitjema

(57) ABSTRACT

An electrostatic lens comprising a first conductive plate with a first aperture, a second conductive plate with a second aperture, the second aperture being substantially aligned with the first aperture, a voltage supply for supplying a first voltage to the first conductive plate and a second voltage to the second conductive plate, the first voltage being lower than the second voltage, and an insulating structure for separating the first conductive plate from the second conductive plate. The insulating structure comprises a first portion in contact with the first conductive plate and a second portion in contact with the second conductive plate, the first portion having an overhanging portion and the second portion having an indented portion at an edge of the insulating structure, so that a gap is formed between the overhanging portion and the second conductive plate.

23 Claims, 5 Drawing Sheets

ELECTROSTATIC LENS STRUCTURE

BACKGROUND OF THE INVENTION

1. Field of the Invention

The invention relates to an electrostatic lens or an electrostatic lens array. Furthermore, the invention relates to a charged particle lithography system comprising such an electrostatic lens or electrostatic lens array. Additionally, the invention relates to a method of manufacturing an insulating structure for use in an electrostatic lens.

2. Description of the Related Art

Electrostatic lenses are used in charged particle beam columns for use in applications like scanning electron microscopes and lithography apparatus. An electrostatic lens typically consists of conductive plates, generally silicon plates provided with a conductive layer, stacked in a direction of the charged particle beam. The conductive plates may be separated by electrically isolating spacers, e.g. made of glass or other suitable insulating materials. The plates and spacers have aligned apertures enabling a charged particle beam to pass through the plates along a charged particle transmission path. The plates may be charged to enable actions such as focusing, blanking and steering of the charged particle beam.

The electric field that can be applied between the plates depends on the plate material properties and the positioning of the plates with respect to each other. Furthermore, the properties and structure of the insulating barrier between the plates, e.g. electrically isolating spacers made of glass or vacuum, are of importance. If the insulating barrier is stressed beyond its dielectric strength, a sudden transition from an insulating state to a highly conductive state takes place. Such a transition may be in the form of an electric discharge or flashover.

The surface of a solid insulator will often provide a path for such an electrical discharge. If such a discharge occurs in a solid dielectric, typically occurring along a surface of the insulator between the plates, changes along a discharge path caused by the discharge can result in a permanent reduction in the dielectric strength of the insulator. As a result, the insulator is degraded and a high electric field cannot be maintained by the electrostatic lens, reducing the performance of the lens.

Conventional efforts to reduce such electrical discharges between conductive plates rely on increasing the length of the breakdown path along surfaces where electrical breakdown is likely to occur, as compared to the direct, i.e. shortest distance between the plates. Examples of this approach are described in Japanese patent publications JP2000260242 and JP2005214908, where beveled or rectangular recesses are included at the location of connection with an electrode.

However, the requirement to maintain the electrode plates close together limits the ability to elongate the discharge path between the electrodes. Furthermore, merely increasing the surface breakdown path length may be insufficient if high electric fields need to be applied between conductive plates positioned in close proximity to each other, e.g. resulting in 10-50 V/micron of electric field to be covered. Therefore, further design measures are needed to enable electrostatic lenses to operate under these circumstances without a considerable risk of electrical breakdown.

SUMMARY OF THE INVENTION

It is an object of the invention to provide an electrostatic lens or electrostatic lens array with an improved performance with respect to electrical breakdown as compared to the state of the art.

The insight behind the invention includes that the flashover occurs, or at least starts, by the extraction and emission of electrons from one of the conductive (electrode) plates, caused by the electric field. Furthermore, the extraction of electrons will be higher at a negative electrode than at a positive electrode, and thus the electric field should be kept low particularly at the negative electrode.

It has also been recognized that electric field enhancement plays a role in causing flashover and recognition of this leads to better methods for preventing flashover. Any enhancement of the electric field should be avoided or reduced, particularly at the negative electrode. Voids between a portion of the insulating structure and one of the conductive plates cause an enhancement or elevation of the electric field locally in the void. The smaller the width of the void in comparison to the distance between the plates, the greater will be any enhancement of the electric field in the void. Such an electric field enhancement makes the location of the void more susceptible to flashover. When such a void occurs at a so-called triple points, i.e. a point at which there is a boundary between air/vacuum, conductor and insulator, the likelihood of an electrical discharge increases considerably. This is particularly the case where the triple point occurs adjacent to a more negative or lower voltage conductive element. Such voids at triple points may occur in practice due to chipping or cracking at the edge of the insulator or as a result of manufacturing errors or tolerances causing surface irregularities during fabrication of the conductive plates or insulating structures.

The invention seeks to provide measures to limit the electric field enhancement, particularly at triple points, and particularly adjacent to a more negative or lower voltage electrode in a electrostatic lens or electrostatic lens array, to permit the lens or lens array to withstand high electric fields while reducing the occurrence of electrical discharges. These measures may be used to avoid the necessity of adopting path elongation measures.

For this purpose, according to one aspect of the invention, an electrostatic lens includes a first conductive plate with a first aperture, a second conductive plate with a second aperture, the second aperture being substantially aligned with the first aperture, a voltage supply for supplying a first voltage to the first conductive plate and a second voltage to the second conductive plate, the first voltage being lower than the second voltage, and an insulating structure for separating the first conductive plate from the second conductive plate. The insulating structure comprises a first portion in contact with the first conductive plate and a second portion in contact with the second conductive plate, the first portion having an overhanging portion and the second portion having an indented portion at an edge of the insulating structure, wherein a gap is formed between the overhanging portion and the second conductive plate.

By this measure, any electric field enhancement in a void at the edge of the insulating structure between the first portion and the first conductive plate can be reduced. This field enhancement will be distributed over the small void and the larger gap below the overhanging portion of the insulating material where the void occurs. Since the void is typically very small and the gap is typically much larger, the field enhancement will be considerably reduced in the void than when the field was concentrated solely therein. The location of the (large) gap structure at the positive or higher voltage electrode further increases the beneficial effect, because in this way the harmful effects are reduced of any voids at the negative or lower voltage electrode that can most easily result in a flashover.

The permittivity of the gap is preferably higher than the permittivity of the insulating structure, preferably at least four times higher. In operation, the electric field strength in the gap between the overhanging portion of the insulating structure and the second conductive plate is preferably greater than the electric field strength across the second portion of the insulating structure. The first portion and the second portion of the insulating structure may be made of equal thickness, and the first portion and the second portion comprise separate structures which are bonded together.

The surface of the insulating structure facing the first conductive plate may be provided with a conductive layer or coating in electrical contact with the first conductive plate for limiting electric field enhancement between the first conductive plate and the insulating structure. The conductive layer may be deposited on a surface of the insulating structure using a deposition technique. The conductive layer may comprise chromium or tantalum, and the insulating structure may comprise borosilicate glass.

The inclusion of a conductive coating on the surface of the insulating structure results in any voids or irregularities on the surface of the insulating structure being covered by the conductive material, which is in electrical contact with the first conductive plate. These surface irregularities, which would have formed field enhancing voids against the surface of the first conductive plate, will have the same surface potential as the first conductive plate, so that there is no electric field in the void. This effectively prevents the occurrence of an enhanced electric field in these voids.

The distance between the first conductive plate and the second conductive plate preferably lies in a range from about 100 to 200 micrometers, and the lens is preferably capable of withstanding an electric field strength within a range from about 10 to 25 volts per micron, and even 25 to 50 volts per micron without flashover occurring.

The invention in another aspect also includes an electrostatic lens array comprising a plurality of electrostatic lenses as described herein. The insulating structure of this electrostatic lens array may take the form of an insulating plate provided with at least one third aperture, the third aperture being arranged such that a projection of its side walls circumscribes multiple first apertures and second apertures. The insulating structure may also take the form of a plurality of elongated bars, such that between successive bars multiple transmission paths formed by first apertures and second apertures are present.

The invention according to another aspect comprises a charged particle beamlet lithography system including a source of charged particles for producing a beam of charged particles, an aperture array for producing a plurality of beamlets from the charged particle beam, a beamlet conditioning system for conditioning the plurality of beamlets in accordance with a pattern, and the electrostatic lens array asd described herein for focusing the plurality of beamlets. The electrostatic lens array may be positioned between the aperture array and the beamlet conditioning system. The charged particle beamlet lithography system may also include a support unit for supporting a substrate to be patterned and the electrostatic lens array positioned downstream of the beamlet conditioning system for focusing a plurality of conditioned beamlets on a target surface of the substrate.

Yet another aspect of invention relates to a method of manufacturing an insulating structure for use in an electrostatic lens, the method comprising providing a first insulating plate, manufacturing at least one first through hole in the first insulating plate, the at least one first through hole having a first diameter, providing a second insulating plate, manufacturing at least one second through hole in the second insulating plate, the at least one second through hole having a second diameter, the second diameter being larger than the first diameter, and combining the first insulating plate and the second insulating plate to form an insulating structure such that the insulating structure has at least one aperture formed by the at least one first and second through holes.

The first and second insulating plates may be made of the same insulating material, and at least one of the plates may comprise borosilicate glass. Manufacturing of the first and/or second through holes may be performed by power blasting.

BRIEF DESCRIPTION OF THE DRAWINGS

Further features and advantages of the invention will be appreciated upon reference to the following drawings, in which:

FIG. 6B shows a detail of the electrostatic lens or electrostatic lens array of FIG. 6a;

DESCRIPTION OF SPECIFIC EMBODIMENTS

Figure 1:
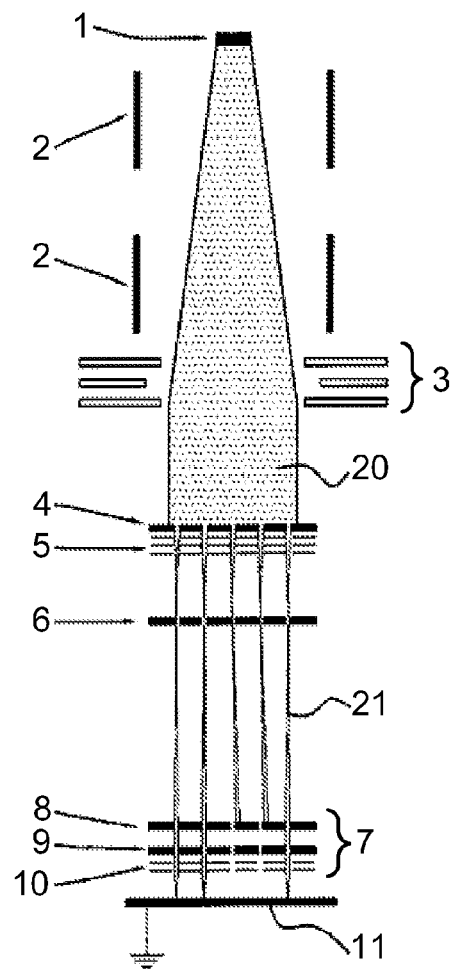
FIG. 1 is a simplified schematic drawing of an example of a charged particle multi beamlet lithography system.

The following is a description of a number of embodiments of the invention, given by way of example only and with reference to the drawings. FIG. 1 schematically shows a simplified schematic drawing of an example of a charged particle multi-beamlet lithography system based upon an electron beam optical system without a common cross-over of all the electron beamlets. Such lithography systems are described for example in U.S. Pat. Nos. 6,897,458, 6,958,804, 7,084, 414, and 7,129,502, which are all hereby incorporated by reference in their entirety, assigned to the owner if the present invention.

The lithography system comprises an electron source 1 for producing a homogeneous, expanding electron beam 20. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a double octopole 2 and subsequently a collimator lens 3 for collimating the electron beam 20. Subsequently, the electron beam 20 impinges on an aperture array 4, which blocks part of the beam and allows a plurality of beamlets 21 to pass through the aperture array 4. The aperture array preferably comprises a plate having through holes. Thus, a plurality of parallel electron beamlets 21 is produced. The system generates a large number of beamlets 21, preferably about 10,000 to 1,000,000 beamlets, although it is of course possible to use more or less beamlets. Note that other known methods may also be used to generate collimated beamlets.

The plurality of electron beamlets 21 pass through a condenser lens array 5 which focuses each of the electron beamlets 21 in the plane of a beam blanker array 6. This beamlet blanker array 6 preferably comprises a plurality of blankers which are each capable of deflecting one or more of the electron beamlets 21.

Subsequently, the electron beamlets 21 enter the end module 7. The end module 7 is provided with a plurality of openings to accommodate the plurality of electron beamlets 21. In one embodiment, each beamlet 21 passes through its own opening, while in another embodiment a group of beamlets 21, converging near an opening, will pass through that opening. The end module 7 is preferably constructed as an insertable, replaceable unit which comprises various components. The end module 7 comprises a beam stop array 8, a beam deflector array 9, and a projection lens arrangement 10, although not all of these need be included in the end module 7 and they may be arranged differently. The end module 7 will, amongst other functions, provide a demagnification of about 50 to 500 times. High values within this range enable r less stringent manufacturing requirements in the upper part of the electron beam lithography system. Furthermore, such high values may enable a reduction of the height of the system. After leaving the end module 7, the beamlets 21 impinge on a surface of a target 11 positioned at a target plane. For lithography applications, the target usually comprises a wafer provided with a charged-particle sensitive layer or resist layer.

In the end module 7, the electron beamlets 21 first pass beam stop array 8. This beam stop array 8 largely determines the opening angle of the beamlets. The beam stop array, in its basic form, comprises a substrate provided with through holes for allowing beamlets to pass through.

The beamlet blanker array 6 and beam stop array 8 operate together to block or let pass the beamlets 21. The passages of the beam stop array 8 may be aligned with the elements of the beam blanker array 6. In such a case, if beamlet blanker array 6 deflects a beamlet, the beamlet will not pass through the corresponding aperture in beam stop array 8, but instead will be blocked. On the other hand, if beamlet blanker array 6 does not deflect a beamlet, the beamlet will pass through the corresponding aperture in beam stop array 8 and will then be projected as a spot on the surface of target 11.

Next, the beamlets pass through a beam deflector array 9 which provides for deflection of each beamlet 21 in the X and/or Y direction, substantially perpendicular to the direction of the undeflected beamlets 21. Next, the beamlets 21 pass through projection lens arrangement 10 and are projected onto a target 11, typically a wafer, in a target plane.

For consistency and homogeneity of current and charge both within a projected spot and among the projected spots on the target, the diameter of the apertures in beam stop array 8 are preferably smaller than the diameter of the beamlets when they reach the beam stop array.

The diameter of the apertures in beam stop plate 8 in the present example limit the cross section of a beamlet. In this way, only a central part of a beamlet is allowed to pass through beam stop plate 8 for projection onto target 11. This central part of a beamlet has a relatively uniform charge density. Furthermore, if the apertures in beam stop array 8 are round, the beamlets passing through the beam stop plate 8 will have a generally uniform opening angle.

Figure 2:
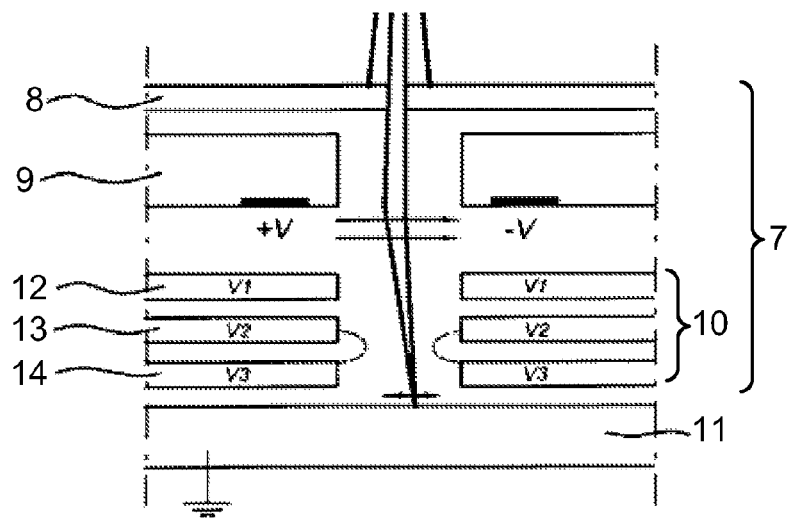
FIG. 2 is a simplified schematic drawing, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 21 are projected onto target 11, preferably resulting in a geometric spot size of about 10 to 30 nanometers in diameter. The projection lens arrangement 10 in such a design preferably provides a demagnification of about 100 to 500 times.

The projection lens arrangement 10, in the embodiment shown in FIG. 2, has three plates 12, 13 and 14 arranged in sequence, used to form an array of electrostatic lenses. The plates 12, 13, and 14 preferably comprise substrates with apertures formed in them. The apertures are preferably formed as round holes though the substrate, although other shapes can also be used. The substrates may be formed of silicon or another semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures.

For example, apertures in plates 12, 13, and 14, if they are made of silicon, may be formed by using a so-called Bosch etching process. The Bosch etching process is a method for anisotropically etching silicon. More details with respect to such a Bosch etching process may be found in European patent 0 625 285 assigned to Robert Bosch GmbH.

A uniform distance (pitch) between the apertures and uniform arrangement of the apertures over the surface of the substrate permits the construction of a system with densely packed beamlets which generate a uniform grid pattern on the target. The pitch between the apertures may be in the range 50 to 500 microns with a deviation in the pitch of preferably 100 nanometers or less. Furthermore, in systems where multiple plates are used, the corresponding apertures in each plate are aligned. Misalignment in the apertures between plates may cause a difference in focal length along different axes.

Uniformity in the size of the apertures enables uniformity in the electrostatic projection lenses formed at the locations of the apertures. The size of the apertures may be in the range of 50 to 150 microns with a deviation in the size of preferably 100 nanometers or less.

Uniformity in the shape of the apertures is also preferred. Where round holes are used, uniformity in the roundness of the holes results in the focal length of the resulting lens being the same all round.

The substrates may be coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example. An electrical voltage is applied to each electrode to control the shape of the electrostatic lenses formed at the location of each aperture. Each electrode is preferably controlled by a single control voltage for the complete array. Thus, in the embodiment shown in FIG. 2 with three electrodes lens there will be only three voltages for all the thousands of lenses.

In FIG. 2, the plates 12, 13, and 14 have electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises a set of electrostatic lenses formed at corresponding points of the arrays of apertures of each plate. Each set of electrostatic lenses forming a projection lens system can be considered as a single effective projection lens, which focuses and demagnifies one or more beamlets, and has an effective focal length and an effective demagnification. In systems where only a single plate is used, a single voltage may be used in conjunction with a ground plane, such that electrostatic lenses are formed at the location of each aperture in the plate.

Variation in the uniformity of the apertures will result in variation in the electrostatic lenses forming at the locations of the apertures. The uniformity of the apertures results in uniform electrostatic lenses. Thus, the three control voltages V1, V2, and V3 create an array of uniform electrostatic lenses which focus and demagnify the large number of electron beamlets 21.

The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates.

The number of plates used in different projection lens arrangements may vary, and the number of common control signals may also vary. Where the apertures have sufficiently uniform placement and dimensions, this enables the focusing of the electron beamlets, and demagnification of the beamlets, using one or more common control signals. In the embodiment of FIG. 2, three common signals comprising the three control voltages V1, V2, and V3 are thus used to focus and demagnify all of the beamlets 21.

The projection lens arrangement preferably forms all of the focusing means for focusing the beamlets onto the target surface. This is made possible by the uniformity of the projection lenses, which provide sufficiently uniform focusing and demagnification of the beamlets so that no correction of the focus and/or path of individual electron beamlets is required. This considerably reduces the cost and complexity of the overall system, by simplifying construction of the system, simplifying control and adjustment of the system, and greatly reducing the size of the system.

Preferably, the placement and dimensions of the apertures where the projection lenses are formed are controlled within a tolerance sufficient to enable focusing of the electron beamlets using one or more common control signals to achieve a focal length uniformity better than 0.05%. The projection lens systems are spaced apart at a nominal pitch, and each electron beamlet is focused to form a spot on the surface of the target. The placement and dimensions of the apertures in the plates are preferably controlled within a tolerance sufficient to achieve a variation in spatial distribution of the spots on the surface of the target of less than 0.2% of the nominal pitch.

The projection lens arrangement 10 may be compact with the plates 12, 13, 14 being located close to each other, so that despite the relatively low voltages used on the electrodes (in comparison to voltages typically used in electron beam optics), it can produce very high electrical fields. These high electrical fields generate electrostatic projection lenses which have a small focal distance, since for electrostatic lenses the focal length can be estimated as proportional to beam energy divided by electrostatic field strength between the electrodes. In this respect, where previously 10 kV/mm could be realized, potential differences of over 10 kV/mm, or even in the range 25 to 50 kV/mm may be provided between the second plate 13 and third plate 14.

These voltages V1, V2, and V3 are preferably set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved dashed lines between plates 13 and 14 in the lens opening. This places the effective lens plane closer to the target and enables the projection lens systems to have a shorter focal length. It is further noted that, for simplicity, the beamlet in FIG. 2 is shown focused as from the deflector 9.

The electrode voltages V1, V2, and V3 are preferably set so that voltage V2 is closer to the voltage of the electron source 1 than is voltage V1, causing a deceleration of the charged particles in beamlet 21. For example, if the target is at 0V (ground potential) and the electron source is at about −5 kV relative to the target, voltage V1 may be about −4 kV, and voltage V2 may be about −4.3 kV. Voltage V3 then may be at about 0V relative to the target, which avoids a strong electric field between plate 14 and the target 11. Such a strong electric field can cause disturbances in the beamlets if the topology of the target is not flat. The distances between the plates (and other components of the projection system) are preferably small.

With this arrangement, a focusing and demagnifying projection lens is realized, as well as a reduction in the speed of extracted charged particles in the beamlets. With the electron source at a voltage of about −5 kV, charged particles are decelerated by the central electrode (plate 13), and subsequently accelerated by the bottom electrode (plate 14) having a voltage at ground potential. This deceleration permits the use of lower electrical fields on the electrodes while still achieving the desired demagnification and focusing for the projection lens arrangement.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

The arrangement of the deflectors and lenses of the end module 7 with respect to one another as described differs from what has generally been expected in the art of particle optics. Typically, a deflector is located after a projection lens, so that the focusing is accomplished first and then the focused beamlet is deflected. First deflecting a beamlet and then focusing it, as in the system in FIG. 2, results in the beamlet entering the projection lens off axis and at an angle with respect to the optical axis of the projection lens. It is evident to the person skilled in the art that the latter arrangement may give rise to off-axis aberrations in the deflected beamlet.

In the lithography applications, a beamlet should be focused and positioned at ultra high precision, with spot sizes of tens of nanometers, with an accuracy in size of nanometers, and a position accuracy in the order of nanometers. The inventors realized that deflecting a focused beamlet, for example several hundreds of nanometers away from the optical axis of a beamlet, would easily result in an out-of-focus beamlet. In order to meet the accuracy requirements, this would severely limit the amount of deflection or the beamlet would rapidly become out of focus at the surface of target 11.

As discussed above, in order to achieve the objectives of the projection lens arrangement in view of its use in a lithography system, the effective focal length of the projection lens systems is short, and the lens plane of the projection lens systems is positioned very close to the target plane. Thus, there is very little space left between the projection lens and the target plane for a beamlet deflection system. The inventors recognized that the focal length should be of such limited magnitude that any deflector or deflector system should be located before the projection lens despite the evident occurrence of off-axis aberrations with such an arrangement.

The arrangement shown in FIGS. 1 and 2 of the deflection array 9 upstream and projection lens arrangement 10 downstream furthermore allows a strong focusing of beamlet 21, in particular to permit a reduction in size (demagnification) of the beamlets of at least about 100 times, and preferably about 350 times, in systems where each projection lens system focuses only one beamlet (or a small number of beamlets). In systems where each projection lens system focuses a group of beamlets, preferably from 10 to 100 beamlets, each projection lens system provides demagnification of at least about 25 times, and preferably about 50 times.

This high demagnification has another advantage in that requirements as to the precision of the apertures and lenses before (upstream of) the projection lens arrangement 10 are much reduced. Another advantage of this arrangement is that the column length (height) of the overall system can be greatly reduced. In this respect, it is also preferred to have the focal length of the projection lens small and the demagnification factor large, so as to arrive to a projection column of limited height, preferably less than one meter from target to electron source, and more preferably between about 150 and 700 mm in height. This design with a short column makes the lithography system easier to mount and house, and it also reduces the effect of drift of the separate beamlets due to the limited column height and shorter beamlet path. This arrangement, however, puts additional demands on the various components of the end module.

With an arrangement as described above, the main lens plane of the projection lens system 10 is preferably located between the two plates 13 and 14. The overall energy of the charged particles in the system according to the embodiments described above is kept relatively low, as mentioned previously. For an electron beam, for example, the energy is preferably in the range of up to about 10 keV. In this way, generation of heat at the target is reduced. However, with such low energy of the charged particles, chromatic aberration in the system increases. The already mentioned relatively high electrostatic field in the projection lens arrangement 10 may counteract this detrimental effect. A high electrostatic field results in forming electrostatic lenses having a low focal length, so that the lenses have low chromatic aberration.

Furthermore, the final plate 14 of the lens system 10 according to the present invention may be made very thin to enable a small focal length without the focal plane being inside the lens. The thickness of plate 14 is preferably within the range of about 50 to 200 μm.

As discussed above, electrostatic lenses used as the projection lens systems discussed with reference to FIGS. 1 and 2, have to function in high electric fields. As mentioned before, this requires well defined plate processing provided with uniformly sized, uniformly pitched and uniformly shaped apertures as well as well defined alignment between plates. A person skilled in the art will readily understand that a risk associated with such electrostatic lenses is an elevated chance of electrostatic discharges.

Such electrostatic discharges could not only be detrimental to the physical structure of electrostatic lens components, but could also negatively effect the control and accuracy of the electron beamlets passing through the lenses.

Electrostatic discharges occur across exposed surfaces located in the apertures and at the edges of the apertures. Generally, such discharges occur in areas of local electrostatic field enhancement where the electrostatic field strength is increased, often where there is large variation in permittivity c. These areas of higher electrostatic field can result sudden electrical discharges or "flashovers" resulting in local breakdown of insulating materials and distortion and deterioration of the electrostatic lens.

Figure 3A:
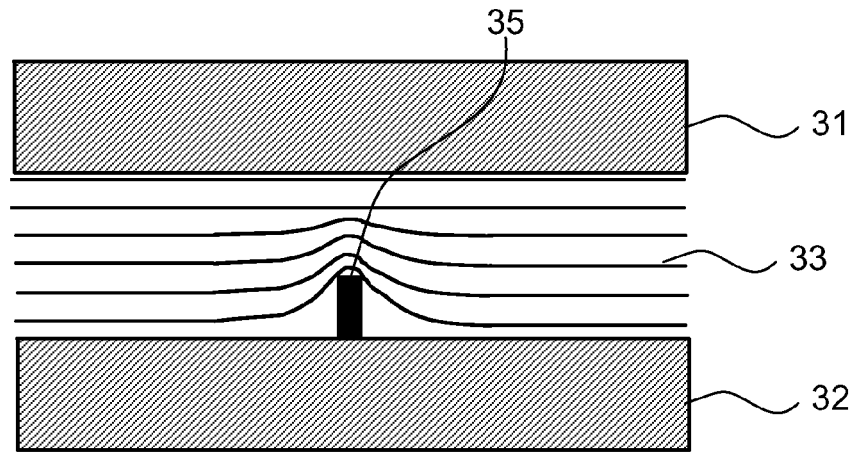
FIGS. 3A-3C schematically depict three electrostatic lens arrangements where field enhancement may occur.
Figure 3B:
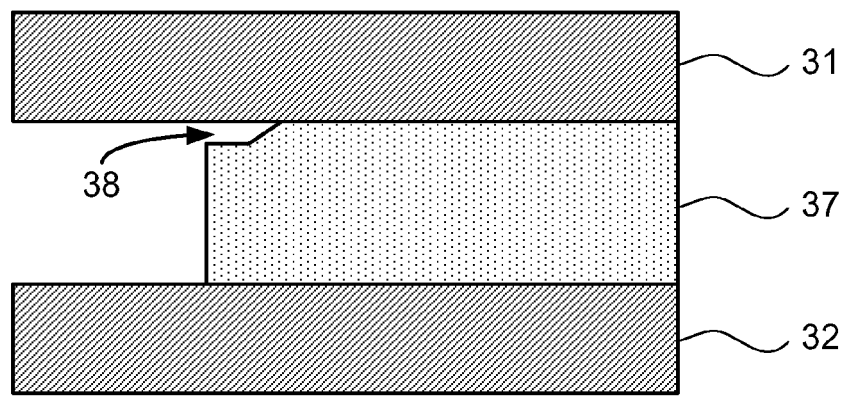
Figure 3C:
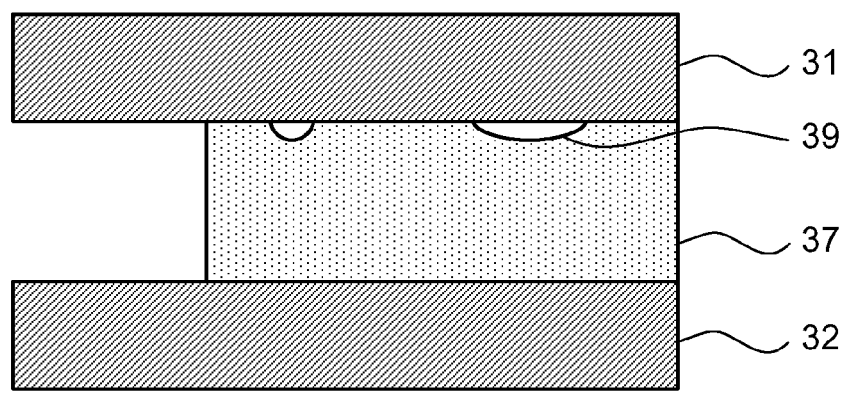

FIGS. 3A-3C schematically depict three situations where such local electrostatic field enhancement and increased risk of flashovers may occur. All figures schematically show a side view of a portion of an electrostatic lens comprising a first electrode 31 and a second electrode 32. A voltage difference between the electrodes 31, 32 is such that field lines 33 of a generated electric field run substantially parallel to the surfaces of the electrodes 31, 32 that face each other.

In FIG. 3A, the second electrode 32 comprises a sharp protrusion 35. As a result of the protrusion 35, especially if the protrusion is conducting, field lines 33 are bent resulting in an elevated electric field around the protrusion 35, i.e. field lines 33 are located closer to each other, particularly at the sharp corners of the protrusion, indicating a higher electric field strength. These higher electric fields increase the chance of electrostatic discharges if the potential of the second electrode 32 is below the potential of the first electrode 31, i.e. electrode 31 is negative with respect to electrode 32. This occurs when the electric field is high enough to pull electrons from the second electrode 32 and start a flow of electrons that will create a flashover.

In FIG. 3B, the first electrode 31 and the second electrode 32 are separated from each other by means of an insulating structure 37, e.g. a spacer made of an insulating material. Due to an imperfection, the first electrode 31 and the insulating structure 37 are not entirely in contact with each other along the upper surface of the insulating structure 37. This may be caused by manufacturing errors or tolerances, irregularities in the surface of the insulating structure or electrode, or chipping or rounding of the edge of the insulating structure. As a result, a small void 38 (shown larger in the drawing for clarity) is present between the insulating structure 37 and the first electrode 37, at the edge of the insulating structure. If there is a significant difference in permittivity between the insulating structure 37 and the permittivity in the void 38 (i.e. the permittivity of air, or vacuum if the equipment is operated in a vacuum chamber), the electric field in the void 38 may be considerably higher than in other areas between the two electrodes.

The average electric field in a gap between electrodes is the potential difference divided by the minimum electrode separation. Where the electrodes are separated by insulating regions or materials having two different dielectric constants, the electric field will be concentrated in the region or material with the lower dielectric constant. The electric field is enhanced in this region or material, i.e. greater than the average electric field between the electrodes. The dielectric constant (k) or relative permittivity of a material is the ratio of its permittivity $\in$ to the permittivity of vacuum $\in_o$, so $k=\in/\in_o$).

Since the dielectric constant/permittivity of the void is lower than the insulating structure, the electric field is enhanced in the void. The smaller the void, the greater field enhancement. This higher electric field increases the chance of electrostatic discharges if the potential of the first electrode 31 is below the potential of the second electrode 32. The imperfection schematically shown in FIG. 3B may be caused by edge chipping of other manufacturing problems.

Also in FIG. 3C, the first electrode 31 and the second electrode 32 are separated from each other by means of an insulating structure 37. In this case, imperfections in the connection between the first electrode 31 and the insulating structure 37, caused for example by irregularities in the surface of the insulating structure or the electrode. These result in the formation of internal voids 39 (enlarged for clarity). The internal voids 39 can create the same problem as the edge voids 38, resulting in locally enhanced electric fields in the voids which may result in an elevated chance of electrostatic discharges if the potential of the first electrode 31 is below the potential of the second electrode 32.

It has been recognized by the inventors that it is of importance to lower the electric field strength at so-called triple points, i.e. a point at which there is a boundary between air/vacuum, conductor and insulator, particularly where the triple point occurs adjacent to a more negative or lower voltage conductive element. Such triple points are present in the arrangements schematically shown in FIGS. 3A-C. By providing measures that limit the electric field enhancement at triple points adjacent to a more negative or lower voltage electrode in the electrostatic lens or electrostatic lens array, the performance of the electrostatic lens or electrostatic lens array with respect to withstanding high electric fields without occurrence of electrical discharge increases considerably. In embodiments of the invention, some of them discussed below, the electrostatic lens or electrostatic lens array is suited to accommodate a field strength of over 10 V/μm up to 25 V/μm, or in a higher range 25-50 V/μm.

Figure 4:
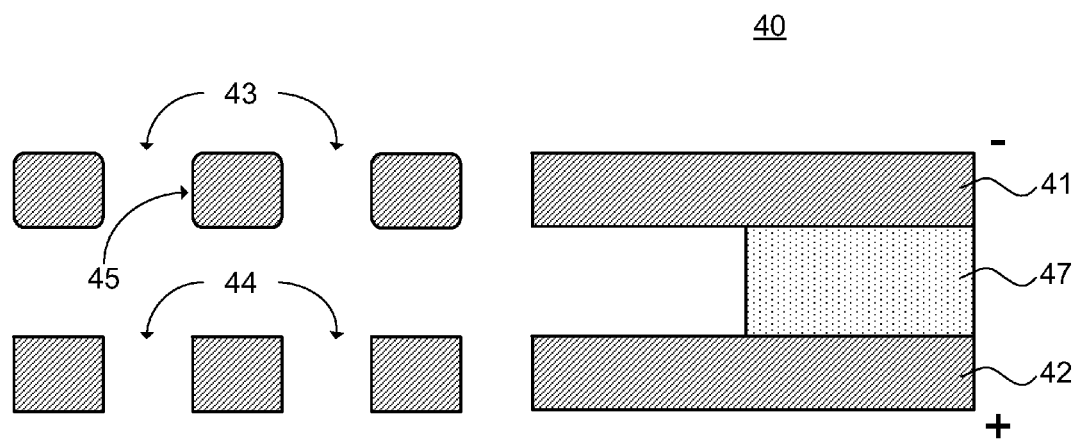
FIG. 4 schematically shows a side view of a portion of an electrostatic lens array according to a first aspect of the invention.

FIG. 4 schematically shows a side view of a portion of an electrostatic lens array 40 according to a first aspect of the invention. The electrostatic lens array 40 comprises a first conductive plate 41 and a second conductive plate 42. The distance between the first conductive plate 41 and the second conductive plate 42 may lie in a range from about 100 to 200 μm. The first conductive plate 41 is arranged to be electrically charged with a potential lower than the potential of the second conductive plate 42. The first conductive plate 41 is provided with a plurality of first apertures 43. The second conductive plate 42 is provided with a plurality of second apertures 44. The plurality of second apertures 44 are substantially aligned with the plurality of first apertures 43. The edges of the first apertures 43 facing the second apertures 44 are rounded. As a result, electrostatic discharges caused by sharp edges, which may act in a similar way as a sharp protrusion as schematically depicted in FIG. 3A, are avoided.

In the embodiment depicted in FIG. 4, not only the edges facing the second apertures 44, but also the edges facing away from the second apertures 44 are rounded. Such an embodiment may be easier to manufacture.

In the embodiment depicted in FIG. 4, an insulating structure 47 has been arranged between the first conductive plate 41 and the second conductive plate 42. The insulating structure 47 is formed such that it enables transmission of charged particle beamlets through the plurality of first apertures 43 and the plurality of second apertures 44. The insulating structure 47 may be used to enhance the structural integrity of the electrostatic lens array. Furthermore, the insulating structure 47 may serve the purpose of positioning the first conductive plate 41 and second conductive plate 42 with respect to each other, acting as a spacer to control the distance between the two plates.

It must be understood, that although the embodiments described with reference to FIG. 4 relate to an electrostatic lens array 40, the same embodiments may be used for a single electrostatic lens. In this case, instead of a plurality of first apertures and a plurality of second apertures, only a single first aperture and a single second aperture are used, in which the second aperture is substantially aligned with the first aperture.

Figure 5:
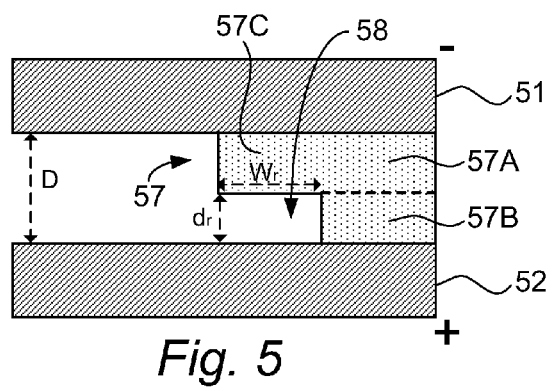
FIG. 5 schematically shows a side view of a portion of an electrostatic lens or lens array according to a second aspect of the invention.

FIG. 5 schematically shows a side view of a portion of an electrostatic lens or electrostatic lens array according to a second aspect of the invention. The electrostatic lens comprises a first conductive plate 51 and a second conductive plate 52. The two conductive plates 51, 52 are separated by means of an insulating structure 57. The insulating structure 57 may have a thickness of about 100-200 μm. The conductive plates 51, 52 are each provided with one or more apertures (not shown), the one or more apertures of the first conductive plate 51 being substantially aligned with corresponding one or more apertures in the second conductive plate 52. The first conductive plate 51 is arranged to be provided with a potential that is lower than or more negative with respect to the potential provided to the second conductive plate 52, as indicated in the diagram by the "−" sign next to plate 51 and the "+" sign next to plate 52.

The insulating structure 57 includes a first portion 57A and a second portion 57B. The first portion 57A is in contact with the first conductive plate 51, while the second portion 57B is in contact with the second conductive plate 52. The portions 57A, 57B of the insulating structure 57 are arranged such that the first portion includes an overhanging portion 57C and the second portion has an indented or recessed portion 58 formed in the wall of the insulator 57, forming a gap between the overhanging portion 57C and the second conductive plate 52. As a result, the difference in permittivity between the insulating structure 57 and the permittivity in the gap or indented portion 58 will result in a proportionally higher electric field developing across the gap than across first portion 57A. A permittivity of the insulating structure 57 of two times or more than in the gap 58 is preferred, and of approximately four times or more is more preferred. For example, the insulator may be constructed to glass with a permittivity approximately 4.7 times the permittivity of a vacuum which occupies the gap 58.

Thus, a field reduction occurs adjacent the more negative plate 51 and a field enhancement occurs in the gap between the first portion 57A and the more positive plate 52. This field enhancement is relatively small and does not cause a problem because the second conductive plate 52 is more positive with respect to the first conductive plate 51. The slightly higher field in the gap will not be sufficient to pull electrons out of the insulator 57 to initiate current flow in a flashover. In addition, the lower field adjacent to the more negative plate 51 further reduces the chance of electrons being pulled out of the conductive plate 51 to begin a flashover.

If the insulating structure 57 comprises an imperfection creating a void adjacent to plate 51 as shown in FIG. 3B (e.g. an edge chipping), the electric field in the void will be increased to a much lesser degree than would be the case with an ordinary shaped insulating structure, e.g. a structure as shown in FIG. 3B. The presence of a recessed portion creating a gap adjacent to plate 52 as shown in FIG. 5 will result in only a lesser field enhancement occurring in both the gap and the void. This lower electric field adjacent to the more negative plate 51 further reduces the chance of an electrostatic discharge. Note that voids may also occur due to surface imperfections in the plate 51, and the gap will similarly address this problem.

It should be noted that forming a recessed portion between the second portion 57B and the first conductive plate 51 is a less preferred solution. Even though such a measure helps to elongate the surface breakdown path, it does not help to lower the electric field at the triple point near the more negative electrode where an edge chipping void may form. On the contrary, such a recessed portion would have a similar effect as the voids in FIG. 3C, i.e. an electric field amplification where an attenuation is desired. Furthermore, forming a recessed portion on both sides of an overhanging portion of the insulating structure so that gaps are formed against both first and second conductive plates 51 and 52 is also a less preferred solution, for the same reason.

The height $d_r$ and/or width $W_r$ of the gap may be varied in view of the requirements of the electrostatic lens (array). In the embodiment shown, the height $d_r$ of the gap 58 is half the distance D between the first conductive plate 51 and the second conductive plate 52. The distance D may lie in a range from about 100 to 200 μm, although other gap heights $d_r$ are also possible, e.g. a height between 0.3-0.7 times the distance D between the plates. Preferably the height $d_r$ of the gap is as large as possible. The higher the proportion of the electric field that develops in the gap, the less likely it is that electrons from the more negative plate 51 will cause a flashover. However, the gap height $d_r$ may be limited by the need to maintain structural integrity of the remaining rim, i.e. the first portion 57A.

In an alternative embodiment, the gap may be located so that it is not adjacent to either of plates 51 or 52, with a rim formed on either side of the gap adjacent to the plates. However, maintaining a rim on both sides of the gap reduces the height of the gap, and the height is again further liited by the need to maintain the structural integrity of the rims of the insulating structure.

Figure 6A:
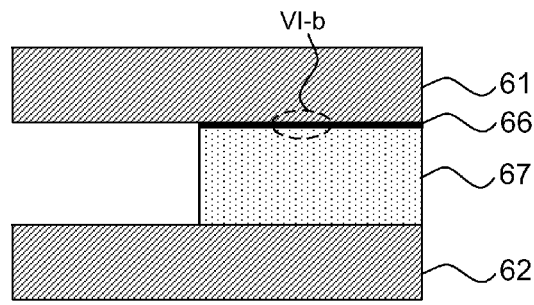
FIG. 6A schematically shows a side view of a portion of an electrostatic lens or electrostatic lens array according to a third aspect of the invention.

FIG. 6A schematically illustrates a side view of a portion of an electrostatic lens or electrostatic lens array according to a third aspect of the invention. The electrostatic lens comprises a first conductive plate 61 and a second conductive plate 62. The two conductive plates 61, 62 are separated by means of an insulating structure 67. The conductive plates 61, 62 are each provided with one or more apertures (not shown), the one or more apertures of the first conductive plate 61 being substantially aligned with corresponding one or more apertures in the second conductive plate 62. The first conductive plate 61 is arranged to be provided with a potential that is lower than the potential provided to the second conductive plate 62.

Figure 6B:
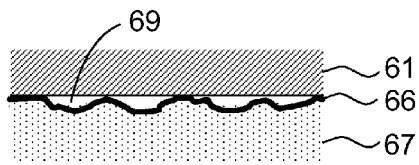

A surface of the insulating structure 67, i.e. the surface facing the first conductive plate 61, is provided with a conductive layer 66. Because the conductive layer 66 is in contact with the first conductive plate 61, it will be have essentially the same electrical potential. If voids 69 are present between the insulating structure 67 and the first conductive plate 61 as described in FIG. 3C, the conductive layer 66 will be formed on the top surface of the insulating structure 67 over the voids as shown in the magnified view of the electrostatic lens schematically depicted in FIG. 6B. The conductive layer 66 may also fill the voids, depending on the size of the voids, the thickness of the conductive layer 66, and process used to form the conductive layer. The conductive layer 66 now forms the interface between the conductive plate 61 and the insulating structure 67, and any voids 69 between the conductive layer 66 and conductive plate 61 and there will be essentially no electric field present in these voids. Hence, flashover due to void-related effects will be minimized. Note that the voids may also occur due to surface imperfections in the first conductive plate 61, and the conductive layer 66 will similarly address this problem.

The conductive layer may be deposited onto the surface of the insulating structure 67 by a suitable depositing technique such as sputtering. The conductive layer may comprise chromium or tantalum or other suitable materials. Furthermore, the insulating structure may comprise a borosilicate glass, e.g. Pyrex, or suitable insulating materials. A borosilicate glass is able to withstand high electric fields, and chromium and tantalum adhere easily to a borosilicate glass, which makes such a combination of materials advantageous. Borosilicate glass is also a suitable insulating material because it can be shaped into a desired format, e.g. by means of a method of manufacturing that will be discussed later, and through holes can be manufactured relatively easy in a plate comprising such a material, e.g. by means of power blasting.

Figure 7:
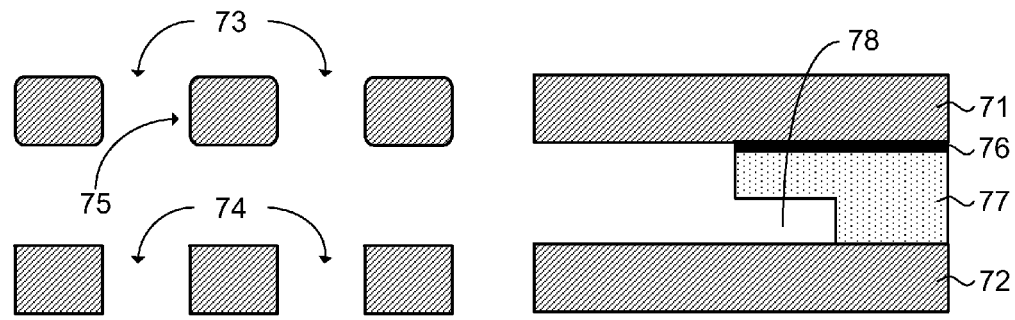
FIG. 7 schematically shows a side view of a portion of an electrostatic lens array combining different aspects of the invention.

FIG. 7 schematically shows a side view of a portion of an electrostatic lens array combining different aspects of the invention. In the embodiment shown, the insulating structure comprises portions forming a gap 78 as discussed with reference to FIG. 5, and a surface of the insulating structure facing the first conductive plate 71 is provided with a conductive layer 76.

It should be understood that the different aspects of the invention may each be used alone, in combination with one or more other aspects of the invention to reduce the chance of electrostatic discharges.

An insulating structure as discussed with reference to FIG. 4 may be manufactured as follows. First, a first insulating plate is provided. In the first insulating plate, at least one first through hole is manufactured. The first through hole has a first diameter. Then, a second insulating plate is provided. In the second insulating plate at least one second through hole is manufactured, with a second diameter larger than the first diameter. Finally, the first insulating plate and the second insulating plate are combined to form an insulating structure with the apertures aligned such that the insulating structure has at least one aperture formed by the first and second through holes.

The second insulating plate may be of a different material than the first insulating plate. Alternatively, the second insulating plate may be of the same material as the first insulating plate. The insulating plates being of the same material has the advantage that discontinuities in electrical and other properties at the boundary surface between the first and second insulating plates will be minimized.

Figure 8A:
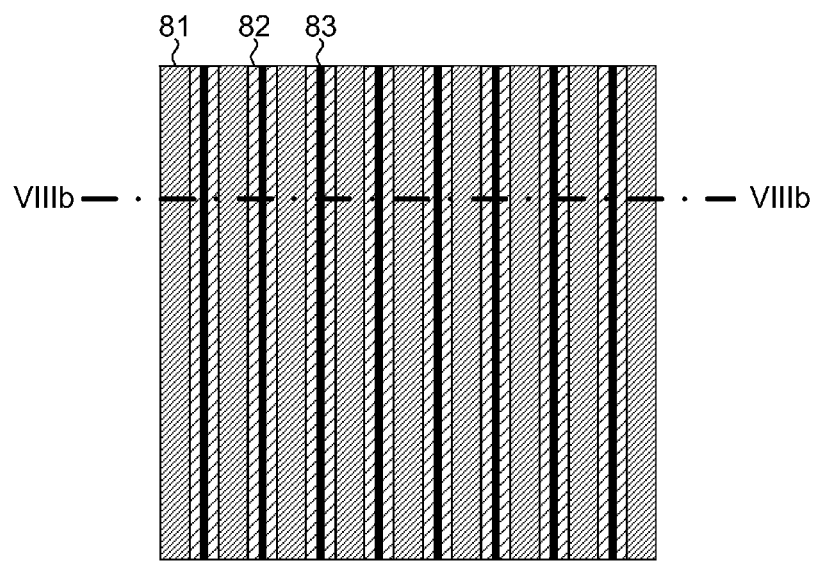
FIG. 8A schematically shows a top view of an electrostatic lens array according to an embodiment of the invention.
Figure 8B:
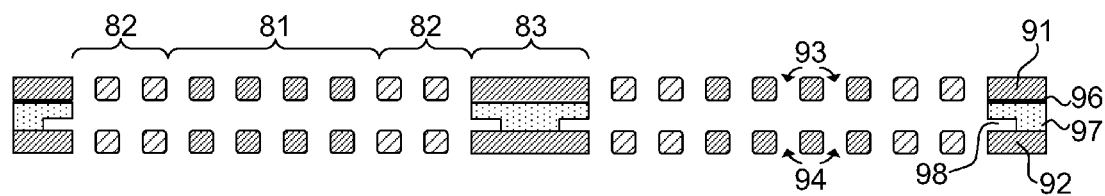
FIG. 8B schematically shows a side view of a portion of the electrostatic lens array of FIG. 8A.

FIG. 8A schematically shows a top view of an electrostatic lens array according to an embodiment of the invention. FIG. 8B schematically shows a side view of a portion of the electrostatic lens array of FIG. 8A. In this embodiment, an insulating structure 97 arranged between a first conductive plate 91 provided with a plurality of first apertures 93 and a second conductive plate 92 provided with a plurality of second apertures 94 takes the form of a plurality of elongate bars or struts. The bars are arranged such that multiple openings formed by the plurality of first apertures 93 and the plurality of second apertures 94 are present between successive bars.

In FIG. 8A, the bars are represented by the black areas 83. Areas 81, 82 correspond with areas provided with openings. In this embodiment, area 82, in FIG. 8a represented by the widely spaced dashed areas, is provided with openings that are not used for providing a path for a charged particle beam. On the other hand, area 81, in FIG. 8B represented by the densely dashed areas, provides openings that serve the purpose of providing a path for a charged particle beam. The openings in area 82 are present to prevent side and/or edge effects. Due to the presence of the openings in area 82, the openings in area 81 experience a substantially identical electrical environment.

FIG. 8B shows an embodiment in which edges of first apertures 93 in the first conductive plate 91 are rounded, a gap 98 is provided between a portion of the insulating structure 97 and the second conductive plate 92, and the insulating structure 97 is provided with a conductive layer 96 at a surface facing the first conductive plate 91. It must be noted that it is also possible to any of the aspects of the invention discussed with reference to FIGS. 4-7, either singly or in various combinations, with an insulating structure in a bar-like format as shown in FIG. 8B.

The invention has been described by reference to certain embodiments discussed above. It will be recognized that these embodiments are susceptible to various modifications and alternative forms well known to those of skill in the art.

The invention claimed is:

1. An electrostatic lens comprising:
   a first conductive plate provided with a first aperture;
   a second conductive plate provided with a second aperture, the second aperture being substantially aligned with the first aperture;
   a voltage supply for supplying a first voltage to the first conductive plate and a second voltage to the second conductive plate, the second voltage being lower than the first voltage with respect to intended function of the lens; and
   an insulating structure for separating the first conductive plate from the second conductive plate;
   wherein the insulating structure comprises a first portion in contact with the first conductive plate and a second portion in contact with the second conductive plate, the first portion having an overhanging portion contacting said first conductive plate and the second portion having an indented portion at an edge of the insulating structure, and wherein a gap is formed between the overhanging portion and the second conductive plate.

2. The electrostatic lens of claim 1, wherein the permittivity of the gap is lower than the permittivity of the insulating structure.

3. The electrostatic lens of claim 2, wherein the permittivity of the gap is at least four times lower than the permittivity of the insulating structure.

4. The electrostatic lens of claim 1, wherein, in operation, the electric field strength in the gap between the overhanging portion of the insulating structure and the second conductive plate is greater than the electric field strength across the second portion of the insulating structure.

5. The electrostatic lens of claim 1, wherein the first portion and the second portion of the insulating structure are of equal thickness.

6. The electrostatic lens of claim 1, wherein the first portion and the second portion of the insulating structure comprise separate structures which are bonded together.

7. The electrostatic lens of claim 1, wherein a surface of the insulating structure facing the first conductive plate is provided with a conductive layer in electrical contact with the first conductive plate for limiting electric field enhancement between the first conductive plate and the insulating structure.

8. The electrostatic lens of claim 7, wherein the conductive layer is deposited on a surface of the insulating structure using a deposition technique.

9. The electrostatic lens of claim 7, wherein said conductive layer comprises chromium or tantalum.

10. The electrostatic lens of claim 1, wherein a distance between the first conductive plate and the second conductive plate lies in a range from about 100 to 200 μm.

11. The electrostatic lens of claim 1, wherein the lens is capable of withstanding a field strength of over 10 V/μm without flashover, and more preferably within a range from 25-50 V/μm without flashover.

12. The electrostatic lens of claim 1, wherein the insulating structure comprises borosilicate glass.

13. An electrostatic lens array comprising a plurality of electrostatic lenses according to claim 1.

14. The electrostatic lens array of claim 13, wherein the insulating structure takes the form of an insulating plate provided with at least one third aperture, the at least one third aperture being arranged such that a projection of its side walls circumscribes multiple first apertures and second apertures.

15. The electrostatic lens array of claim 13, wherein the insulating structure takes the form of a plurality of elongated bars, such that between successive bars multiple transmission paths formed by first apertures and second apertures are present.

16. A charged particle beamlet lithography system comprising:
   a source of charged particles for producing a beam of charged particles;
   an aperture array for producing a plurality of beamlets from the charged particle beam;
   a beamlet conditioning system for conditioning the plurality of beamlets in accordance with a pattern; and
   the electrostatic lens array according to claim 13 for focusing the plurality of beamlets.

17. The charged particle beamlet lithography system of claim 16, wherein said electrostatic lens array is positioned between said aperture array and said beamlet conditioning system.

18. The charged particle beamlet lithography system of claim 16, wherein said charged particle beamlet lithography system further comprises a support unit for supporting a substrate to be patterned and said electrostatic lens array is positioned downstream of said beamlet conditioning system for focusing a plurality of conditioned beamlets on a target surface of the substrate.

19. A method of manufacturing an insulating structure for use in an electrostatic lens, the method comprising:
   providing a first insulating plate;
   manufacturing at least one first through hole in said first insulating plate, said at least one first through hole having a first diameter;
   providing a second insulating plate;
   manufacturing at least one second through hole in said second insulating plate, said at least one second through hole having a second diameter, said second diameter being larger than said first diameter; and
   combining the first insulating plate and the second insulating plate to form an insulating structure such that said insulating structure has at least one aperture formed by said at least one first and second through holes.

20. The method of claim 19, wherein the first insulating plate and the second insulating plate are made of the same insulating material.

21. The method of claim 19, wherein at least one of the first insulating plate and the second insulating plate comprises borosilicate glass.

22. The method according to claim 19, wherein at least one of the manufacturing the at least one first through hole and the manufacturing the at least one second through hole is performed by power blasting.

23. An insulating structure for use in an electrostatic lens manufactured according to the method of claim 19.

* * * * *